United States Patent
Tachikawa et al.

(10) Patent No.: US 7,033,731 B2
(45) Date of Patent: *Apr. 25, 2006

(54) MULTILAYERED BODY FOR PHOTOLITHOGRAPHIC PATTERNING

(75) Inventors: Toshikazu Tachikawa, Yokohama (JP); Fumitake Kaneko, Kanagawa-ken (JP); Naotaka Kubota, Kanagawa-ken (JP); Miwa Miyairi, Kanagawa-ken (JP); Takako Hirosaki, Hiratsuka (JP); Koutaro Endo, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/901,207

(22) Filed: Jul. 29, 2004

(65) Prior Publication Data

US 2005/0008972 A1    Jan. 13, 2005

Related U.S. Application Data

(60) Continuation of application No. 10/160,160, filed on Jun. 4, 2002, now abandoned, which is a division of application No. 09/641,686, filed on Aug. 18, 2000, now Pat. No. 6,455,228.

(30) Foreign Application Priority Data

Aug. 25, 1999   (JP) .................................. 11-237783

(51) Int. Cl.
    G03F 7/11    (2006.01)
(52) U.S. Cl. .................................. 430/273.1; 430/271.1
(58) Field of Classification Search ............. 430/271.1, 430/273.1
    See application file for complete search history.

(56) References Cited

U.S. PATENT DOCUMENTS

| | | | |
|---|---|---|---|
| 4,710,264 A | 12/1987 | Waschler et al. |
| 4,731,319 A | 3/1988 | Kohara et al. |
| 4,784,936 A | 11/1988 | White et al. |
| 5,541,263 A | 7/1996 | Thackeray et al. |
| 5,631,314 A | 5/1997 | Wakiya et al. |
| 5,886,102 A | 3/1999 | Sinta et al. |
| 5,925,495 A | 7/1999 | Sato et al. |
| 6,074,801 A | 6/2000 | Iwasa et al. |
| 6,136,500 A | 10/2000 | Kobayashi et al. |
| 6,455,228 B1 | 9/2002 | Tachikawa et al. |
| 2001/0006758 A1 | 7/2001 | Kai et al. |

FOREIGN PATENT DOCUMENTS

| | | |
|---|---|---|
| EP | 0 164 248 | 12/1985 |
| EP | 0 613 050 | 8/1994 |
| EP | 0 849 634 | 6/1998 |
| JP | 5-34922 | 2/1993 |
| JP | 6-138660 | 5/1994 |
| JP | 7-306531 | 11/1995 |
| JP | 8-179508 | 7/1996 |
| JP | 9-166870 | 6/1997 |
| JP | 10-10733 | 1/1998 |
| JP | 10-254135 | 9/1998 |

*Primary Examiner*—Cynthia Hamilton
(74) *Attorney, Agent, or Firm*—Wenderoth, Lind & Ponack, L.L.P.

(57) ABSTRACT

Disclosed is a novel multilayered body for photo-lithographic patterning of a photoresist layer from which a patterned resist layer having an excellent cross sectional profile can be obtained when the multilayered structure comprises, on the surface of a substrate, an underlying water-insoluble anti-reflection film and a negative-working photoresist layer of a specific photoresist composition comprising:

(A) 100 parts by weight of an alkali-soluble resin;
(B) from 0.5 to 20 parts by weight of an onium salt compound capable of releasing an acid by irradiation with actinic rays; and
(C) from 3 to 50 parts by weight of a glycoluril compound substituted by at least one hydroxyalkyl group or alkoxyalkyl group at the N-position.

7 Claims, No Drawings

MULTILAYERED BODY FOR PHOTOLITHOGRAPHIC PATTERNING

This is a continuation of Ser. No. 10/160,160, filed Jun. 4, 2002, now abandoned, which is a divisional of Ser. No. 09/641,686, filed Aug. 18, 2000, now U.S. Pat. No. 6,455,228.

BACKGROUND OF THE INVENTION

The present invention relates to a multilayered body for photolithographic patterning or, more particularly, to a multilayered body for photolithographic patterning of a resist layer comprising a substrate, a first anti-reflection coating film formed on the surface of the substrate, a layer of a specific negative-working photoresist composition on the first anti-reflection coating film and, optionally, a second anti-reflection coating film formed on the resist layer and suitable for obtaining, with high photosensitivity, a patterned resist layer of high pattern resolution having excellently orthogonal cross sectional profile with little edge roughness.

Along with the trend in recent years toward higher and higher degree of integration in various semiconductor devices, the photolithographically patterned resist layer on a substrate surface is required to have a pattern resolution of as fine as 250 nm or, as a target in the coming generation, as fine as 200 nm. Needless to say, such an extremely fine pattern resolution of the patterned resist layer cannot be accomplished without an innovative improvement in the performance of the photosensitive patterning material which may be a photosensitive material for patterning of a chemical-amplification negative-working photoresist layer.

The above mentioned chemical-amplification negative-working photoresist composition is typically formulated with an acid-curable alkali-soluble resin such as a phenolic resin, a radiation-sensitive acid-generating agent and a crosslinking agent for the resin such as an addition product of urea or melamine and formaldehyde. It is usual that a photoresist layer of a chemical-amplification negative-working photoresist composition is formed not directly on the surface of a substrate but on an undercoating layer of an anti-reflection film of a water-insoluble anti-reflection compound formed on the substrate surface in view of the advantage relative to the pattern resolution which can be as fine as 200 nm or even finer.

It is sometimes the case, however, that, when a conventional chemical-amplification negative-working photoresist composition is used in combination with an anti-reflection coating film including organic films formed from the most typical commercial products of the DUV Series (each a product by Brewer Science Co.) as well as inorganic anti-reflection coating films, an excellently orthogonal cross sectional profile of the patterned resist layer can hardly be obtained and the cross sectional profile is more or less trapezoidal or skirt trailing. Accordingly, it is one of the target problems in the development works for negative-working photoresist compositions to obtain a chemical-amplification negative-working photoresist composition capable of being used in combination with an anti-reflection coating film without being influenced in the pattern resolution and cross sectional profile of the patterned resist layer.

It is sometimes the case that formation of a resist pattern is accompanied by an undesirable phenomenon of "edge roughness", especially, when the resist pattern width is extremely fine to be 200 nm or smaller.

It is known according to the disclosure in Japanese Patent No. 2878150, on the other hand, that, when a photo-resist layer of a positive-working or negative-working photoresist composition of the chemical-amplification type is provided thereon with an anti-reflection film of a water-soluble anti-reflection compound, an improvement in the pattern resolution and suppression of the adverse influences of standing waves can be accomplished.

Although it is a possible way that a substrate surface is provided with three coating layers successively consisting of a first anti-reflection film of a water-insoluble anti-reflection compound, a photoresist layer and a second anti-reflection film of a water-soluble anti-reflection compound, the photolithographic patterning work by using such a patterning material cannot be very efficient because both of the steps for removal of the water-soluble anti-reflection film and etching of the water-insoluble anti-reflection film. Accordingly, it is usual in the manufacturing process of semiconductor devices in which a very high throughput of the products is essential that the photolithographic patterning material has a two-layered coating on the substrate consisting either of a water-insoluble anti-reflection film and a photoresist layer thereon or of a photoresist layer and a water-soluble anti-reflection film thereon.

A patterning material having a two-layered coating consisting of a negative-working photoresist layer and a water-soluble anti-reflection film thereon has a problem that an unnecessary crosslinking reaction proceeds at or in the vicinity of the interface between the two coating layers eventually resulting in a T-formed cross sectional profile of the patterned resist layer. While it is eagerly desired to obtain a patterned resist layer having excellently orthogonal cross sectional profile, in addition, attention in the development works is now switched to a patterning material of the three-layered coating from which a patterned resist layer having an excellently orthogonal cross sectional profile by overcoming the problems of a skirt trailing cross sectional profile at the interface between the water-insoluble anti-reflection coating film and the photoresist layer and a T-formed cross sectional profile at the interface between the photoresist layer and the water-soluble anti-reflection film thereon.

SUMMARY OF THE INVENTION

The present invention accordingly has an object to provide a novel and improved multilayered body for photolithographic patterning of a photoresist layer free from the above described problems and disadvantages in the conventional multilayered body for resist patterning.

Thus, the multilayered body for photolithographic patterning of a photoresist layer provided by the present invention comprises, as an integrally layered body:

(a) a substrate;
(b) an anti-reflection coating film formed on the surface of the substrate from a water-insoluble anti-reflection compound in a thickness in the range from 30 to 300 nm; and
(c) a photoresist layer having a thickness in the range from 200 to 500 nm formed on the anti-reflection coating film from a negative-working photoresist composition comprising
(A) 100 parts by weight of an alkali-soluble resin;
(B) from 0.5 to 20 parts by weight of an onium salt compound capable of releasing an acid by the irradiation with actinic rays; and
(C) from 3 to 50 parts by weight of a glycoluril compound substituted at the N-positions by at least one crosslink-forming substituent group selected from hydroxyalkyl groups and alkoxyalkyl groups.

Though optional, the anti-reflection coating film (b) contains an acid.

It is further optional that the patterning material comprises (d) a second anti-reflection coating film formed on the photoresist layer (c) from a water-soluble anti-reflection compound which comprises a water-soluble resinous ingredient and a fluoroalkyl sulfonate compound or fluoroalkyl carboxylate compound.

DETAILED DESCRIPTION OF THE PREFERRED EMBODIMENTS

A variety of substrate plates can be used without particular limitations depending on the intended applications. Typical examples of applicable substrate materials include semiconductor silicon wafers with or without an undercoating film of SiON, SiN, $Si_3N_4$, polycrystalline silicon and TiN and glass plates having a coating film of a metal such as tantalum and chromium.

In the next place, the anti-reflection film formed on one surface of the substrate is limited to a water-insoluble anti-reflection film which may be inorganic or organic. An inorganic water-insoluble anti-reflection coating film is formed usually by the chemical vapor-phase deposition (CVD) method of an inorganic material while an organic water-insoluble anti-reflection coating film is formed usually by coating the substrate surface with a coating solution containing an organic ultraviolet absorbing polymeric compound in an organic solvent followed by drying and a heat treatment. The thus formed water-insoluble anti-reflection coating film usually has a thickness in the range from 30 to 300 nm.

Several commercial products of an anti-reflection coating solution for an organic water-insoluble anti-reflection film are available including a product sold under the trade name of DUV-42 (a product by Brewer Science Co.).

It is sometimes the case that, when a patterned resist layer is formed by using a photolithographic patterning material prepared by forming a negative-working photoresist layer on a substrate surface having a water-insoluble anti-reflection coating film, an undesirable phenomenon of skirt trailing is found in the cross sectional profile of the patterned resist layer at the interface with the anti-reflection coating film. The mechanism of this undesirable phenomenon is presumably that an acid ingredient in the anti-reflection coating film infiltrates to the photoresist layer in the course of the post-exposure baking treatment of the patterning material. In this regard, the present invention provides a remarkable improvement of preventing the phenomenon of skirt trailing in the cross sectional profile of the patterned resist layer even when the photoresist layer is formed on a water-insoluble anti-reflection coating film containing a relatively large amount of an acid ingredient.

It is further optional that an additional anti-reflection coating film, which must be soluble in water, is formed on the photoresist layer in a thickness of 35 to 45 nm. The water-soluble anti-reflection coating film formed as the topmost layer is effective for improving the pattern resolution of the patterned resist layer and preventing the adverse influences of the standing waves in the pattern-wise exposure to actinic rays.

The water-soluble anti-reflection coating film is formed by coating the surface of the photoresist layer with an aqueous coating solution containing a water-soluble resinous compound such as polyvinyl pyrrolidone and polyvinyl alcohol and a fluorine-containing surface active agent including perfluoroalkyl sulfonic acids, e.g., perfluorooctyl and perfluorodecyl sulfonic acids, or perfluoroalkyl carboxylic acids, e.g., perfluoroheptanoic acid and perfluorooctanoic acid, in the form of an ammonium salt, tetramethylammonium hydroxide salt or monoethanolamine salt.

The negative-working photoresist layer in the inventive patterning material is formed by using a photoresist composition comprising (A) an alkali-soluble resinous compound, (B) a radiation-sensitive acid-generating compound which is an onium salt compound and (C) a glycoluril compound substituted by at least one crosslink-forming group selected from lower hydroxyalkyl groups and lower alkoxyalkyl groups at the N-positions as the essential ingredients with optional admixture of (D) an aliphatic amine compound and/or (E) an acid compounds selected from carboxylic acids and phosphorus-containing oxoacids or esters thereof. A photoresist composition comprising the components (A), (B) and (C) is disclosed, for example, in Japanese Patent Kokai 10-254135.

The use of this photoresist composition in a photolithographic patterning material has been established as a result of the extensive investigations undertaken by the inventors with an object to develop a photosensitive patterning material of which the total thickness of a negative-working photoresist layer and a water-insoluble anti-reflection film does not exceed 800 nm leading to an unexpected discovery that this object can well be accomplished by a negative-working photoresist composition of the above mentioned formulation.

The component (A) in the negative-working photoresist composition is an alkali-soluble resinous compound which is not particularly limitative and can be selected from a variety of alkali-soluble resins conventionally used in chemical-amplification photoresist compositions. Examples of alkali-soluble resinous compound particularly preferable from the standpoint of obtaining a patterned resist layer having excellent photosensitivity, pattern resolution and cross sectional profile of the patterned resist layer include copolymeric resins having a weight-average molecular weight of 2000 to 4000 and consisting of 60 to 97% by moles of hydroxystyrene units and 40 to 3% by moles of styrene units, copolymeric resins having a weight-average molecular weight of 2000 to 4000 and consisting of 60 to 97% by moles of hydroxystyrene units and 40 to 3% by moles of styrene units, of which from 5 to 30% of the hydroxyl groups in the hydroxy-styrene units are substituted by alkali-insoluble groups and polyhydroxystyrene resins having a weight-average molecular weight of 2000 to 4000, of which from 3 to 40% of the hydroxyl groups in the hydroxystyrene units are substituted by alkali-insoluble groups. More preferably, the alkali-soluble resin as the component (A) is a copolymeric resin having a weight-average molecular weight of 2000 to 4000 and consisting of 60 to 97% by moles of hydroxystyrene units and 40 to 3% by moles of styrene units when excellent orthogonality of the cross sectional profile of the patterned resist layer is essential.

The alkali-insoluble group mentioned above is a group which has an effect to decrease the alkali-solubility of a basically alkali-soluble resin when the resin is substituted by such groups. Examples of the alkali-insoluble group suitable for the purpose include tertiary-alkoxycarbonyl groups such as tert-butoxycarbonyl group and tert-amyloxy-carbonyl group and lower alkyl groups having 1 to 4 carbon atoms such as methyl group, ethyl group, propyl group, isopropyl group, n-butyl group and isobutyl group, of which the lower alkyl group or, in particular, isopropyl group is preferable in view of obtaining a good patterned resist layer under little influences by the ambient conditions.

The acid-generating agent as the component (B) in the photoresist composition is a compound capable of releasing an acid by decomposition under irradiation with actinic rays. While a variety of radiation-sensitive acid-generating compounds are known and used in chemical-amplification photoresist compositions, the component (B) in the photoresist composition is a specific onium salt compound of which the anionic moiety is a fluoroalkyl sulfonate anion. Such an onium salt compound is a known compound as disclosed in Japanese Patent Kokai 54-95686, 62-229942 and 2-120366 and elsewhere.

It is taught in Japanese Patent Publication 8-3635 that a preferable acid-generating agent in a negative-working photoresist composition for pattern-wise exposure with a KrF excimer laser beam is tris(2,3-dibromopropyl) isocyanurate because this compound has an advantage of high transparency to the KrF excimer laser beams and high pattern resolution of the patterned resist layer obtained by using this compound as the acid-generating agent.

This compound, from which a halogenoacid is generated by irradiation with actinic rays, however, is not suitable for use in a photoresist composition containing a glycoluril compound as a crosslinking agent because the effective photosensitivity of the photoresist composition cannot be high enough as to be applicable to an actual production line of LSIs.

Besides the above named halogenoacid-generating compound, sulfonic acid-generating compounds, such as bis(cyclohexyl-sulfonyl) diazomethane, are also known and used as an acid-generating agent in chemical-amplification photoresist compositions. These compounds are also not suitable for use in combination with a glycoluril compound substituted at the N-atoms by crosslink-forming groups selected from hydroxyalkyl groups and lower alkoxyalkyl groups because a patterned resist layer of high pattern resolution can hardly be obtained with a photoresist composition formulated with these compounds as the acid-generating agent and crosslinking agent.

It is the unexpected discovery leading to the present invention that the above described various problems can be overcome by combining a specific onium salt compound as the acid-generating agent and a specific glycoluril compound as the crosslinking agent in a negative-working photoresist composition to give a patterned resist layer of excellent properties.

The anionic moiety of the onium salt compound as the component (B) is a fluoroalkyl sulfonate anion. The fluoroalkyl group thereof can be a partially fluorinated or fully fluorinated alkyl group. The number of carbon atoms in the fluoroalkyl group is not particularly limitative. It is preferable, however, that the fluoroalkyl group is a perfluoroalkyl group having 1 to 10 carbon atoms because of the general trend that the acid strength of the fluoroalkyl sulfonic acid is increased as the degree of fluorination of the fluoroalkyl group is increased and the number of carbon atoms in the fluoroalkyl group is relatively small not to exceed 10.

On the other hand, the cationic moiety as the counterpart of the fluoroalkyl sulfonate anion to form the onium salt compound as the component (B) is not particularly limitative and can be selected from conventional ones. Examples of suitable cations include diphenyliodonium cations and triphenylsulfonium cations optionally substituted by one or more of lower alkyl groups such as methyl, ethyl, propyl, n-butyl and tert-butyl groups, di(lower alkyl) monophenylsulfonium cations, lower alkylcyclohexyl 2-oxocyclohexylsulfonium cations and the like.

Examples of particularly preferable cations include diphenyliodonium cations represented by the general formula

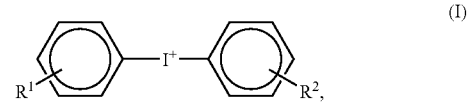

in which $R^1$ and $R^2$ are each a hydrogen atom, alkyl group having 1 to 4 carbon atoms or alkoxy group having 1 or 2 carbon atoms, such as diphenyliodonium and bis(4-tert-butylphenyl) iodonium cations, triphenylsulfonium cations represented by the general formula

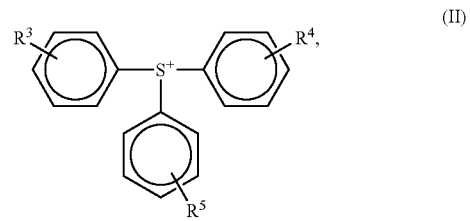

in which $R^3$, $R^4$ and $R^5$ are each a hydrogen atom, alkyl group having 1 to 4 carbon atoms or alkoxy group having 1 or 2 carbon atoms, such as triphenylsulfonium, tris(4-methyl-phenyl)sulfonium and tris(4-methoxyphenyl)sulfonium cations, phenyl dialkylsulfonium cations represented by the general formula

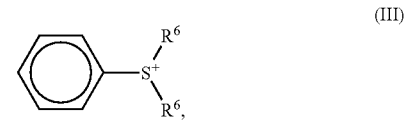

in which each $R^6$ is an alkyl group having 1 to 4 carbon atoms, such as dimethylphenylsulfonium cations and alkyl cyclohexyl 2-oxocyclohexyl sulfonium cations represented by the general formula

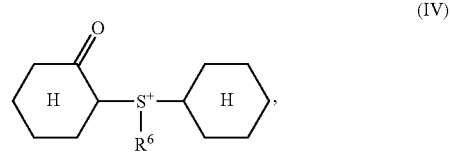

in which $R^6$ has the same meaning as defined above, such as methyl cyclohexyl 2-oxocyclohexylsulfonium cation.

The onium salt compounds particularly preferable as the component (B) in the photoresist composition are those formed from these cations and trifluoromethane sulfonate or nona-fluorobutane sulfonate anion or, more preferably, those formed from the triphenylsulfonium cation expressed by the above given general formula (II) and trifluoromethane sulfonate or nonafluorobutane sulfonate anion. These onium salt compounds can be used either singly or as a combination of two kinds or more.

The amount of the onium salt compound as the component (B) in the photoresist composition is in the range from 0.5 to 20 parts by weight or, preferably, from 5 to 15 parts by weight per 100 parts by weight of the alkali-soluble resin as the component (A). When the amount of the component (B) is too small, the photosensitivity of the photoresist composition cannot be high enough. When the amount of the component (B) is too large, on the other hand, the photoresist composition suffers a decrease in the focusing depth latitude or in the storage stability.

It is essential in the present invention that the negative-working photoresist composition is formulated with a crosslinking agent as the component (C) which is a specific glycoluril compound substituted by a hydroxyalkyl group and/or an alkoxyalkyl group at the N-position or positions.

The activity of these glycoluril compounds for crosslinking is generally low as compared with alkoxymethylated melamine compounds and alkoxymethylated urea compounds conventionally used as a crosslinking agent in negative-working photoresist compositions. The low crosslinking activity of the glycoluril compound is rather an advantageous factor when used in combination with an onium salt compound as the acid-generating agent in respect of the improvements of the defective cross sectional profile of the patterned resist layer such as skirt trailing and edge roughness as well as the T-formed cross sectional profile when a water-soluble anti-reflection coating film is provided on top of the photoresist layer.

The above mentioned N-substituted glycoluril compound can be prepared by the condensation reaction of glycoluril with formaldehyde to form a hydroxymethyl-substituted compound which can be further reacted with a lower alcohol to give an alkoxymethyl-substituted glycoluril compound.

Particular examples of the N-substituted glycoluril compound suitable as the component (C) in the photoresist composition include mono-, di-, tri- and tetra(hydroxymethyl) glycolurils, mono-, di-, tri- and tetra(methoxymethyl) glycolurils, mono-, di-, tri- and tetra(ethoxymethyl) glycolurils, mono-, di-, tri- and tetra(propoxymethyl) glycolurils and mono-, di-, tri- and tetra(butoxymethyl) glycolurils. Several commercial products of these N-substituted glycoluril compounds which can be used as the component (C) in the photoresist composition are available on the market including those sold under a trade name of N2702 (each a product by Sanwa Chemical Co.) in the forms of mostly the trimer or tetramer as well as in the form of a mixture of the monomer, dimer and trimer.

The amount of the glycoluril compound as the component (C) in the photoresist composition is in the range from 3 to 50 parts by weight or, preferably, from 10 to 20 parts by weight per 100 parts by weight of the component (A). When the amount of the component (C) is too small, the crosslink formation of the resinous ingredient cannot proceed completely resulting in poor properties of the patterned resist layer. When the amount of the component (C) is too large, the photoresist composition suffers a decrease in the storage stability or decrease in the photosensitivity with eventual formation of a particulate matter in the solution during storage.

In addition to the above described essential ingredients, i.e. components (A), (B) and (C), it is optional that the photoresist composition is admixed with an aliphatic lower-alkyl or -alkanol amine compound as the component (D) and/or a carboxylic acid or an oxoacid of phosphorus as well as an ester thereof as the component (E). These additional ingredients are known and conventionally employed in negative-working chemical-amplification photoresist compositions in the prior art.

Examples of the above mentioned aliphatic amine compound as the component (D) include tertiary amines such as trimethylamine, triethylamine, tripropylamine, tributylamine, tripentylamine, triethanolamine and tripropanolamine and secondary amines such as dipropylamine, dibutylamine, dipentylamine and dipropanolamine.

The amount of the component (D) in the photoresist composition, when added, is in the range from 0.01 to 1.0 part by weight per 100 parts by weight of the component (A).

Examples of preferable carboxylic acids as the component (E) in the photoresist composition include malonic acid, citric acid, malic acid, succinic acid, benzoic acid and salicylic acid.

Examples of the oxoacid of phosphorus or a ester thereof as the other class of the component (E) include phosphoric and phosphorous acids and esters thereof such as phosphoric acid, phosphorous acid, di(n-butyl) phosphate and diphenyl phosphate, phosphonic acid and esters thereof such as phosphonic acid, dimethyl phosphonate, di(n-butyl) phosphonate, phenyl phosphonate, diphenyl phosphonate and dibenzyl phosphonate and phosphinic acid and esters thereof such as phosphinic acid and phenyl phosphinate.

The amount of the component (E) in the photoresist composition, when added, is in the range from 0.01 to 1.0 part by weight per 100 parts by weight of the component (A).

It is optional that the photoresist composition is admixed with the component (D) alone, component (E) alone or both of the components (D) and (E) in combination.

Various further additives can optionally be added to the photoresist composition including, for example, surface active agents having effectiveness to improve the film-forming properties of the photoresist composition in the formation of a photoresist layer.

The photoresist composition used in the present invention is prepared usually in the form of a uniform solution by dissolving the above described essential ingredients and optional ingredients in an organic solvent which is not particularly limitative provided that the solubility of each ingredient therein is high enough. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more. It is preferable that the organic solvent is a mixture of propyleneglycol monomethyl ether and propyleneglycol monomethyl ether acetate in a mixing proportion of 50:50 to 80:20 by weight in consideration of the good solubility behavior to the components (B) and (C).

The present invention provides a photosensitive patterning material which is an integrally layered body comprising (a) a substrate plate, (b) a water-insoluble anti-reflection film formed on the surface of the substrate plate and (c) a photoresist layer formed on the anti-reflection film from the above described negative-working photoresist composition.

The water-insoluble anti-reflection coating film is formed on the substrate surface in a thickness in the range from 30 to 300 nm. This thickness of the water-insoluble anti-reflection film as well as the thickness of the photoresist layer formed thereon are each an important factor affecting the quality of the patterned resist layer relative to the pattern resolution and orthogonality of the cross sectional profile thereof. In this regard, the photoresist layer formed from the photoresist composition should have a thickness in the range from 200 to 700 nm or, preferably, from 200 to 500 nm or, more preferably, from 200 to 400 nm. When the thickness of the photoresist layer deviates out of the range, satisfactory quality of the patterned resist layer cannot be ensured relative to the dimensional accuracy and orthogonality of the cross sectional profile to negate the advantages to be obtained by the combined use of the specific components (B) and (C).

In the following, the present invention is described in more detail by way of Examples. In the following description, the term of "parts" always refers to "parts by weight".

EXAMPLE 1

A negative-working photoresist solution was prepared by dissolving, in a solvent mixture of 700 parts of propyleneglycol monomethyl ether and 300 parts of propyleneglycol monomethyl ether acetate:
100 parts of a copolymeric resin having a weight-average molecular weight of 2500 and consisting of 80% by moles of hydroxystyrene units and 20% by moles of styrene units as the component (A);
3 parts of triphenylsulfonium trifluoromethane sulfonate as the component (B);
10 parts of tetramethoxymethyl glycoluril (N2702, a product by Sanwa Chemical Co) as the component (C);
0.2 part of tributylamine as the component (D);
0.2 part of salicylic acid as the component (E); and
a fluorosilicone-based surface active agent (X-70-093, a product by Shin-Etsu Chemical Co.) in an amount of 700 ppm by weight based on the total amount of the non-volatile ingredients,
followed by filtration of the solution through a membrane filter of 200 nm pore diameter.

Separately, a 6-inch semiconductor silicon wafer was coated on one surface with an organic anti-reflection coating solution (DUV-42, supra) followed by drying and a heat treatment at 180° C. for 60 seconds to form an anti-reflection coating film of 80 nm thickness.

The negative-working photoresist solution prepared above was applied onto the anti-reflection coating film on a spinner rotating at 2500 rpm for 30 seconds followed by drying on a hot plate at 90° C. for 60 seconds to give a photoresist layer having a thickness of 500 nm.

The thus formed photoresist layer was pattern-wise exposed to KrF excimer laser beams on a minifying projection exposure machine (Model FPA-3000EX3, manufactured by Canon Co.) followed by a post-exposure baking (PEB) treatment at 110° C. for 60 seconds and then subjected to a development treatment as a puddle development with a 2.38% by weight aqueous solution of tetramethylammonium hydroxide at 23° C. for 60 seconds followed by rinse for 15 seconds in a running stream of pure water and drying to give a negatively patterned resist layer.

The critical resolution of the line-and-space patterned resist layer was 180 nm. The cross sectional profile of the line-patterned resist layer of the critical resolution was excellently orthogonal standing upright on the substrate surface without skirt trailing in the vicinity of the interface with the anti-reflection layer.

The minimum exposure dose for obtaining a patterned resist layer of 180 nm line width was 40 mJ/cm$^2$ which was taken as a measure of the photosensitivity of the photoresist composition. The thus line-patterned resist layer was almost free from edge roughness.

EXAMPLE 2

A negative-working photoresist solution was prepared in the same formulation as in Example 1 except that the triphenylsulfonium trifluoromethane sulfonate was replaced with the same amount of dimethyl phenyl sulfonium trifluoromethane sulfonate.

The same patterning procedure as in Example 1 was under-taken by using the thus prepared photoresist solution to find that the critical pattern resolution was for a line-and-space pattern of 180 nm line width and the photosensitivity therefor was 50 mJ/cm$^2$. The cross sectional profile of the line-patterned resist layer was excellently orthogonal standing upright on the substrate surface without skirt trailing in the vicinity of the interface with the anti-reflection film. The thus line-patterned resist layer was almost free from edge roughness.

EXAMPLE 3

A negative-working photoresist solution was prepared in the same formulation as in Example 1 except that the alkali-soluble resin as the component (A) was replaced with the same amount of a polyhydroxystyrene resin having a weight-average molecular weight of 3000, of which 20% of the hydroxyl groups were substituted by isopropyl groups as an alkali-insoluble group.

The same patterning procedure as in Example 1 was undertaken by using the thus prepared photoresist composition to find that the critical pattern resolution was for a line-and-space pattern of 180 nm line width and the photosensitivity therefor was 30 mJ/cm$^2$. The cross sectional profile of the line-patterned resist layer was excellently orthogonal standing upright on the substrate surface without skirt trailing in the vicinity of the interface with the anti-reflection film. The thus line-patterned resist layer was almost free from edge roughness.

EXAMPLE 4

A negative-working photoresist solution was prepared in the same formulation as in Example 1 except that the tetramethoxymethylated glycoluril as the component (C) was replaced with the same amount of tetrabutoxymethylated glycoluril.

The same patterning procedure as in Example 1 was undertaken by using the thus prepared photoresist composition to find that the critical pattern resolution was for a line-and-space pattern of 180 nm line width and the photosensitivity therefor was 45 mJ/cm$^2$. The cross sectional profile of the line-patterned resist layer was excellently orthogonal standing upright on the substrate surface without skirt trailing in the vicinity of the interface with the anti-reflection film. The thus line-patterned resist layer was almost free from edge roughness.

EXAMPLE 5

The formulation of the negative working photoresist solution was the same as in Example 1 except that the solvent used here was a mixture of 1050 parts of propyleneglycol monomethyl ether and 450 parts of propyleneglycol monomethyl ether acetate. The procedure for the patterning test with the thus prepared photosensitive solution was also the same as in Example 1 except that the photoresist layer formed on the anti-reflection film had a thickness of 300 nm instead of 500 nm.

The results of the patterning test were that the critical pattern resolution was 150 nm and the minimum exposure dose for obtaining a line-patterned resist layer of 150 nm was 40 mJ/cm$^2$. The cross sectional profile of the patterned resist layer was excellently orthogonal standing upright on the substrate surface without skirt trailing in the vicinity of the interface with the anti-reflection film. The thus line-patterned resist layer was almost free from edge roughness.

EXAMPLE 6

A negative-working photoresist solution was prepared in the same formulation as in Example 5 except that the alkali-soluble resin as the component (A) was replaced with the same amount of a polyhydroxystyrene resin having a weight-average molecular weight of 3000, of which 20% of the hydroxyl groups were substituted by isopropyl groups as an alkali-insoluble group.

The same patterning procedure as in Example 5 was under-taken by using the thus prepared photoresist solution to find that the critical pattern resolution was for a line-and-space pattern of 150 nm line width and the photosensitivity therefor was 35 mJ/cm$^2$. The cross sectional profile of the line-patterned resist layer was excellently orthogonal standing upright on the substrate surface without skirt trailing in the vicinity of the interface with the anti-reflection film. The thus line-patterned resist layer was almost free from edge roughness.

EXAMPLE 7

A negative-working photoresist solution was prepared in the same formulation as in Example 5 except that the tetramethoxymethylated glycoluril as the component (C) was replaced with the same amount of tetrabutoxymethylated glycoluril.

The same patterning procedure as in Example 1 was undertaken by using the thus prepared photoresist solution to find that the critical pattern resolution was for a line-and-space pattern of 150 nm line width and the photosensitivity therefor was 40 mJ/cm$^2$. The cross sectional profile of the line-patterned resist layer was excellently orthogonal standing upright on the substrate surface without skirt trailing in the vicinity of the interface with the anti-reflection film. The thus line-patterned resist layer was almost free from edge roughness.

EXAMPLE 8

A 6-inch semiconductor silicon wafer was provided on one surface, in the same manner as in Example 5, successively with an organic anti-reflection film of 80 nm thickness and a negative-working photoresist layer of 300 nm thickness with the same photoresist solution.

The photoresist layer on the substrate surface was further coated with an anti-reflection coating solution of a water-soluble type (TSP-9AEX, a product by Tokyo Ohka Kogyo Co.) followed by drying to form a second anti-reflection film having a thickness of 42 nm, which was water-soluble.

The same patterning test as in Example 5 was undertaken for the above obtained photoresist layer sandwiched between two anti-reflection films.

The critical pattern resolution was for a line-and-space pattern of 150 nm line width and the photosensitivity therefor was 40 mJ/cm$^2$. The cross sectional profile of the line-patterned resist layer was excellently orthogonal standing upright on the substrate surface without skirt trailing in the vicinity of the interface with the water-insoluble organic anti-reflection film and also without T-formed broadening at the top portion which had been in contact with the water-soluble anti-reflection coating film. The thus line-patterned resist layer was almost free from edge roughness.

EXAMPLE 9

A 6-inch semiconductor silicon wafer was provided on one surface, in the same manner as in Example 1, successively with a water-insoluble organic anti-reflection film of 80 nm thickness and a negative-working photoresist layer of 500 nm thickness with the same photoresist solution.

The photoresist layer on the anti-reflection film was further coated with an anti-reflection coating solution of a water-soluble type (TSP-9AEX, supra) followed by drying to form a second anti-reflection film having a thickness of 42 nm, which was water-soluble.

The same patterning test as in Example 1 was undertaken for the above obtained photoresist layer sandwiched between two anti-reflection films.

The critical pattern resolution was for a line-and-space pattern of 180 nm line width and the photosensitivity therefor was 40 mJ/cm$^2$. The cross sectional profile of the line-patterned resist layer was excellently orthogonal standing upright on the substrate surface without skirt trailing in the vicinity of the interface with the anti-reflection film and also without T-formed broadening at the top portion which had been in contact with the water-soluble anti-reflection coating film. The thus line-patterned resist layer was almost free from edge roughness.

COMPARATIVE EXAMPLE 1

The formulation of the negative-working photoresist solution was the same as in Example 1 except that the components (B) and (C) were replaced with 5 parts of tris(2,3-dibromopropyl) isocyanurate and 10 parts of methoxymethylated urea (MX-290, a product by Sanwa Chemical Co.), respectively.

A patterning test was undertaken in the same manner as in Example 1 by using the above prepared photoresist solution to obtain the results that the critical pattern resolution was for a line-and-space pattern of 200 nm line width and the photosensitivity therefor was 100 mJ/cm$^2$. The cross sectional profile of the patterned resist layer had trailing skirts at the interface with the anti-reflection coating film below.

COMPARATIVE EXAMPLE 2

The formulation of the negative-working photoresist solution was the same as in Example 1 except that the component (B) was replaced with 5 parts of tris(2,3-dibromodibromopropyl) isocyanurate.

A test patterning procedure was undertaken in the same manner as in Example 1 with the thus prepared photoresist solution but failed to give a patterned resist layer.

COMPARATIVE EXAMPLE 3

The formulation of the negative-working photoresist solution was the same as in Example 1 except that the component (B) was replaced with 5 parts of bis(cyclohexylsulfonyl) diazomethane.

A patterning test was undertaken in the same manner as in Example 1 by using the above prepared photoresist solution to obtain the results that the critical pattern resolution was for a line-and-space pattern of 300 nm line width and the photosensitivity therefor was 50 mJ/cm$^2$. The cross sectional profile of the patterned resist layer had trailing skirts in the vicinity of the interface with the anti-reflection coating film below.

What is claimed is:

1. A multilayered body for photolithographic patterning of a photoresist layer which comprises, as an integrally layered body:
   (a) a substrate;
   (b) a water-insoluble anti-reflection film formed on the surface of the substrate in a thickness in the range from 30 to 300 nm; and
   (c) a photoresist layer having a thickness in the range from 200 to 500 nm formed on the anti-reflection film from a negative-working photoresist composition comprising, as a uniform solution in an organic solvent,
      (A) 100 parts by weight of an alkali-soluble resin which is a copolymeric resin having a weight-average molecular weight of 2000 to 4000 and consisting of 60 to 97% by moles of hydroxystyrene units and 40 to 3% by moles of styrene units;
      (B) from 0.5 to 20 parts by weight of an onium salt compound having an anionic part which is the fluoroalkyl sulfonate anion, said salt being capable of releasing an acid by irradiation with actinic rays;
      (C) from 3 to 50 parts by weight of a glycoluril compound substituted by at least one hydroxyalkyl group or alkoxyalkyl group at the N-position; and
      (D) from 0.01 to 1.0 part by weight of an aliphatic amine compound per 100 parts by weight of the component (A).

2. The multilayered body for photolithographic patterning of a photoresist layer as claimed in claim 1 in which the anti-reflection film of (b) contains an acid.

3. The multilayered body for photolithographic patterning of a photoresist layer as claimed in claim 1 which further comprises:
   (d) a water-soluble anti-reflection coating film formed on the photoresist layer.

4. The multilayered body for photolithographic patterning of a photoresist layer as claimed in claim 3 in which the water-soluble anti-reflection coating film of (d) comprises a water-soluble resinous compound and a fluoroalkyl sulfonate or a fluoroalkyl carboxylate.

5. The multilayered body for photolithographic patterning of a photoresist layer as claimed in claim 3 in which the water-soluble anti-reflection coating film of (d) has a thickness in the range from 35 to 45 nm.

6. The multilayered body for photolithographic patterning of a photoresist layer as claimed in claim 1 in which the negative-working photoresist composition of (c) further comprises:
   (B) from 0.01 to 1.0 part by weight of a carboxylic acid, a phosphorus-containing oxoacid or an ester of a phosphorus-containing oxoacid per 100 parts by weight of the component (A).

7. The multilayered body for photolithographic patterning of a photoresist layer as claimed in claim 1, in which the thickness of the photoresist layer is in the range from 200 to 400 nm.

* * * * *

UNITED STATES PATENT AND TRADEMARK OFFICE
CERTIFICATE OF CORRECTION

| | |
|---|---|
| PATENT NO. | : 7,033,731 B2 |
| APPLICATION NO. | : 10/901207 |
| DATED | : April 25, 2006 |
| INVENTOR(S) | : Toshikazu Tachikawa et al. |

It is certified that error appears in the above-identified patent and that said Letters Patent is hereby corrected as shown below:

Column 14, line 5 of claim 6, please replace "(B)" with --(E)--.

Signed and Sealed this

Eleventh Day of July, 2006

JON W. DUDAS
*Director of the United States Patent and Trademark Office*